(12) United States Patent
Moon et al.

(10) Patent No.: US 10,483,339 B2
(45) Date of Patent: Nov. 19, 2019

(54) ORGANIC LIGHT-EMITTING DEVICE INCLUDING A BRIDGE ELECTRODE

(71) Applicant: SAMSUNG DISPLAY CO., LTD., Yongin-si, Gyeonggi-Do (KR)

(72) Inventors: Sangho Moon, Yongin-si (KR); Sungho Kim, Yongin-si (KR); Sangkyung Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 158 days.

(21) Appl. No.: 15/334,704

(22) Filed: Oct. 26, 2016

(65) Prior Publication Data

US 2017/0170251 A1    Jun. 15, 2017

(30) Foreign Application Priority Data

Dec. 14, 2015  (KR) .......................... 10-2015-0178502

(51) Int. Cl.
*H01L 27/32* (2006.01)
*H01L 29/786* (2006.01)
(Continued)

(52) U.S. Cl.
CPC ...... *H01L 27/3262* (2013.01); *H01L 27/3248* (2013.01); *H01L 27/3276* (2013.01);
(Continued)

(58) Field of Classification Search
CPC .................. H01L 27/3248; H01L 29/7869
See application file for complete search history.

(56) References Cited

U.S. PATENT DOCUMENTS

2001/0030323 A1* 10/2001 Ikeda ................ H01L 29/78645
257/59
2005/0275038 A1* 12/2005 Shih .................. H01L 29/78633
257/382
(Continued)

FOREIGN PATENT DOCUMENTS

JP        2014-199913    10/2014
KR   10-2013-0115657    10/2013
(Continued)

*Primary Examiner* — Lex H Malsawma
*Assistant Examiner* — Geoffrey H Ida
(74) *Attorney, Agent, or Firm* — F. Chau & Associates, LLC

(57) ABSTRACT

An organic light-emitting device includes an oxide semiconductor layer disposed in a pixel area. The oxide semiconductor layer includes a channel region, a source region and a drain region. A gate insulating layer is disposed on the oxide semiconductor layer. A gate electrode is disposed on the gate insulating layer. A conductive layer is disposed between the substrate and the oxide semiconductor layer. A bridge electrode is in contact with the conductive layer and one of the source region and the drain region. A first insulation film covers the gate electrode and the bridge electrode. An organic light-emitting diode includes a pixel electrode. An emissive layer is disposed on the pixel electrode, and an opposite electrode is disposed on the emissive layer. At least a portion of the oxide semiconductor layer overlaps the organic light-emitting diode. The conductive layer includes a light transmittance material.

20 Claims, 6 Drawing Sheets

(51) Int. Cl.
*H01L 29/417* (2006.01)
*H01L 27/12* (2006.01)

(52) U.S. Cl.
CPC .... *H01L 29/41733* (2013.01); *H01L 29/7869* (2013.01); *H01L 27/1214* (2013.01); *H01L 2251/5315* (2013.01)

(56) References Cited

U.S. PATENT DOCUMENTS

| | | | | |
|---|---|---|---|---|
| 2011/0115839 | A1* | 5/2011 | Takahashi | H01L 27/1225 257/59 |
| 2013/0270527 | A1* | 10/2013 | Kwon | H01L 33/0041 257/40 |
| 2014/0138674 | A1* | 5/2014 | Sato | H01L 29/7869 257/43 |
| 2014/0183528 | A1 | 7/2014 | Endo | |

FOREIGN PATENT DOCUMENTS

| KR | 10-2015-0034077 | 4/2015 |
|---|---|---|
| KR | 10-2015-0037795 | 4/2015 |

* cited by examiner

ORGANIC LIGHT-EMITTING DEVICE INCLUDING A BRIDGE ELECTRODE

CROSS-REFERENCE TO RELATED APPLICATION

This application claims priority under 35 U.S.C. § 119 to Korean Patent Application No. 10-2015-0178502, filed on Dec. 14, 2015, in the Korean Intellectual Property Office, the disclosure of which is incorporated by reference herein in its entirety.

1. Technical Field

Exemplary embodiments of the present invention related to a display device, and more particularly to an organic light-emitting device.

2. Discussion of Related Art

In a display device, such as an organic light-emitting diode device and a liquid crystal display device, patterns, which include at least one thin film transistor (TFT), a capacitor, and wiring connecting the TFT to the capacitor, may be formed on a substrate. The TFT may include an active layer to provide a channel area, a source area, and a drain area, and a gate electrode electrically insulated from the active layer by a gate insulation layer.

The active layer of the TFT may include a semiconductor material such as amorphous silicon or polysilicon. When the active layer of the TFT includes amorphous silicon, mobility of electrons or carriers may be reduced, and thus an ability to generate a driving circuit for high-speed performance may be reduced. When the active layer of the TFT includes polysilicon, the mobility of the electrons or carriers may increase, but a threshold voltage might not be uniform, and thus a separate compensation circuit may be included in the TFT, which may compensate for the non-uniform threshold voltage.

SUMMARY

One or more exemplary embodiments of the present invention may include an organic light-emitting device of a front emission type having a thin film transistor of a top-gate type.

According to one or more exemplary embodiments of the present invention, an organic light-emitting device includes a substrate having a pixel area, and an oxide semiconductor layer disposed in the pixel area. The oxide semiconductor layer includes a channel region, a source region and a drain region. The channel region is disposed between the source region and the drain region. A gate insulating layer is disposed on the oxide semiconductor layer. A gate electrode is disposed on the gate insulating layer. A conductive layer is disposed between the substrate and the oxide semiconductor layer. A bridge electrode is in contact with the conductive layer and one of the source region and the drain region of the oxide semiconductor layer. A first insulation film covers the gate electrode and the bridge electrode. An organic light-emitting diode includes a pixel electrode disposed on the first insulation film in the pixel area. An emissive layer is disposed on the pixel electrode, and an opposite electrode is disposed on the emissive layer. At least a portion of the oxide semiconductor layer overlaps the organic light-emitting diode. The conductive layer includes a light transmittance material.

According to one or more exemplary embodiments of the present invention, a first portion of the conductive layer may overlap the channel region.

According to one or more exemplary embodiments of the present invention, a length of the oxide semiconductor layer in a first direction, a width of the first portion of the conductive layer in the first direction, and a width of the gate electrode in the first direction may satisfy a condition of $W_G \leq W_B < La$. La is the length of the oxide semiconductor layer in the first direction, $W_B$ is the width of the first portion of the conductive layer in the first direction, and $W_G$ is the width of the gate electrode in the first direction.

According to one or more exemplary embodiments of the present invention, the conductive layer may include a second portion which overlaps the bridge electrode.

According to one or more exemplary embodiments of the present invention, one of the source region and the drain region may be disposed between the first portion and the second portion.

According to one or more exemplary embodiments of the present invention, the conductive layer need not be overlapped with at least one of the source region and the drain region of the oxide semiconductor layer.

According to one or more exemplary embodiments of the present invention, the pixel electrode may include a reflective electrode, and the opposite electrode may include a transparent electrode or a semi-transparent electrode.

According to one or more exemplary embodiments of the present invention, the conductive layer may include at least one of a transparent conductive oxide layer and a semi-transparent metal layer.

According to one or more exemplary embodiments of the present invention, the bridge electrode may contact the conductive layer and the source region of the oxide semiconductor layer, respectively.

According to one or more exemplary embodiments of the present invention, the organic light-emitting device may include a buffer layer disposed between the conductive layer and the oxide semiconductor layer, and an interlayer insulation film disposed between the gate electrode and the bridge electrode. The bridge electrode may be in contact with the oxide semiconductor layer, which is exposed through a first hole which passes through the interlayer insulation film. The bridge electrode may be in contact with the conductive layer, which is exposed through a second hole which passes through the buffer layer.

According to one or more exemplary embodiments of the present invention, an organic light-emitting device included a substrate having a transistor area and an emissive area. A semiconductor layer is disposed on the transistor area. The semiconductor layer includes a channel region, a source region and a drain region. The source region and the drain region are spaced apart from each other. The channel region is disposed between the source region and the drain region. A gate electrode overlaps the channel region, and is disposed on the semiconductor layer. A conductive layer is disposed between the substrate and the semiconductor layer. A bridge electrode connects the conductive layer to one of the source region and the drain region of the semiconductor layer. A first insulation film covers the gate electrode and the bridge electrode. A pixel electrode is disposed on the first insulation film to be on the emissive area. An emissive layer is disposed on the pixel electrode. An opposite electrode is disposed opposite to the pixel electrode. The emissive layer is disposed between the opposite electrode and the pixel electrode. At least a portion of the semiconductor area overlaps the emissive area. The conductive layer includes a light transmittance material.

According to one or more exemplary embodiments of the present invention, the semiconductor layer may include an oxide of at least one of indium (In), gallium (Ga), tin (Sn), zirconium (Zr), Vanadium (V), hafnium (Hf), cadmium(Cd), germanium (Ge), Chrome (Cr), titanium (Ti), and zinc (Zn).

According to one or more exemplary embodiments of the present invention, a first portion of the conductive layer may overlap the channel region.

According to one or more exemplary embodiments of the present invention, a width of the first portion of the conductive layer in a first direction from the drain region to the source region may be less than a length of the semiconductor layer in the first direction.

According to one or more exemplary embodiments of the present invention, a width of the first portion of the conductive layer in a first direction from the drain region to the source region may be equal to or greater than a width of the gate electrode in the first direction.

According to one or more exemplary embodiments of the present invention, the conductive layer may include a second portion which is spaced apart from the first portion and overlaps the bridge electrode.

According to one or more exemplary embodiments of the present invention, the conductive layer need not be overlapped with at least one of the source region and the drain region.

According to one or more exemplary embodiments of the present invention, the pixel electrode may be a reflective electrode, and the opposite electrode may be a transparent electrode or a semi-transparent electrode.

According to one or more exemplary embodiments of the present invention, the conductive layer may include at least one of a transparent conductive oxide and a semi-transparent metal.

According to one or more exemplary embodiments of the present invention, the bridge electrode may contact the conductive layer and the source region of the semiconductor layer, respectively.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
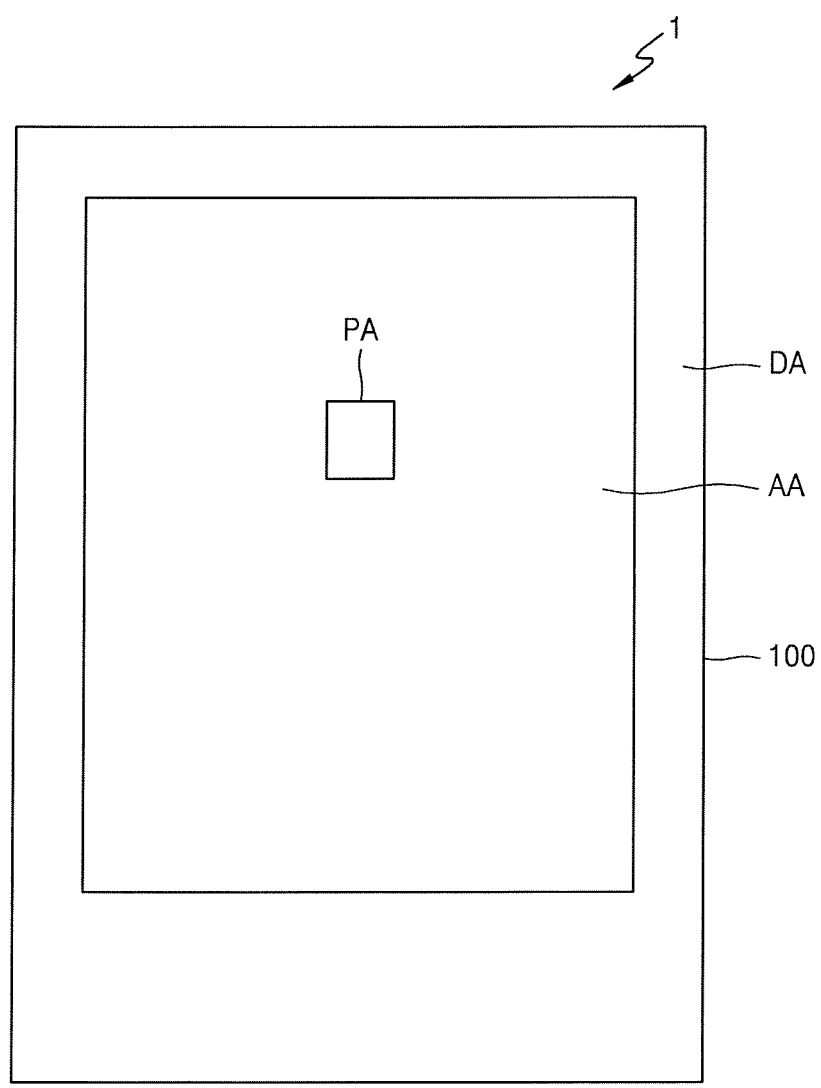
FIG. 1 is a plan view schematically illustrating an organic light-emitting device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

When a certain embodiment may be implemented differently, a specific process order may be performed differently from the described order.

It will be understood that when a layer, region, or component is referred to as being "connected" to another layer, region, or component, it may be "directly connected" to the other layer, region, or component or may be "indirectly connected" to the other layer, region, or component with another layer, region, or component disposed between the first and second layers, regions or components.

Figure 2:
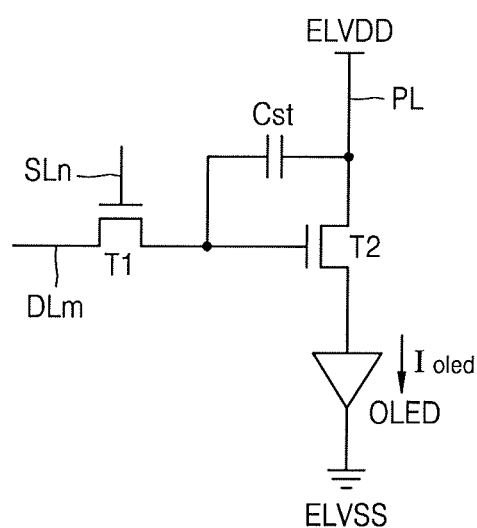
FIG. 2 is an equivalent circuit diagram of a pixel according to an exemplary embodiment of the present invention.

FIG. 1 is a plan view schematically illustrating an organic light-emitting device 1 according to an exemplary embodiment of the present invention. FIG. 2 is a cross-sectional view of the display device illustrated in FIG. 1.

Referring to FIG. 1, a substrate 100 of the organic light-emitting device 1 may include an active area AA, which displays an image, and a dead area DA, which is adjacent to the active area AA and does not display an image. The active area AA may include pixel areas PA, and each pixel area PA may include a pixel to emit light. The image may be displayed by the light emitted from a plurality of pixels.

The dead area DA may surround the active area AA and may include a driver such as a scan driver and a data driver to transmit signals to the plurality of pixels of the active area AA.

A protection substrate may be disposed on the substrate 100. For example, the active area AA may be protected from external foreign materials by a sealing material surrounding the active area AA and disposed between the protection substrate and the substrate 100. According to another exemplary embodiment of the present invention, a thin film encapsulation unit may be disposed on the active area AA and may protect the active area AA from external foreign materials.

Referring to FIG. 2, each pixel may include at least one switching thin film transistor T1, a driving thin film transistor T2, a storage capacitor Cst, and an organic light-emitting diode OLED to emit light of a predetermined luminance according to a driving current $I_{oled}$.

In an exemplary embodiment of the present invention, a gate electrode of the switching thin film transistor T1 may be connected to a scan line SLn. One of a source electrode and a drain electrode of the switching thin film transistor T1 may be connected to a data line DLm, and the other one of the source electrode and the drain electrode of the switching thin film transistor T1 may be connected to the storage capacitor Cst. When the switching thin film transistor T1 is supplied with a scan signal from the scan line SLn, the switching thin film transistor T1 may be turned on and may supply a data signal, which is transmitted through the data line DLm, to the storage capacitor Cst. The storage capacitor Cst may be charged with a voltage corresponding to the data signal.

The driving thin film transistor T2 may be connected to the power line PL and storage capacitor Cst, and may control the driving current $I_{oled}$ from the power line PL to OLED based on a voltage value charged on the storage capacitor Cst. The OLED may emit light of a predetermined luminance according to the driving current $I_{oled}$.

Although FIG. 2 illustrates a case in which each pixel includes two thin film transistors T1 and T2, exemplary embodiments of the present invention are not limited to the two thin film transistors T1 and T2. For example, three or more thin film transistors may be included in each pixel, as desired.

Figure 3:
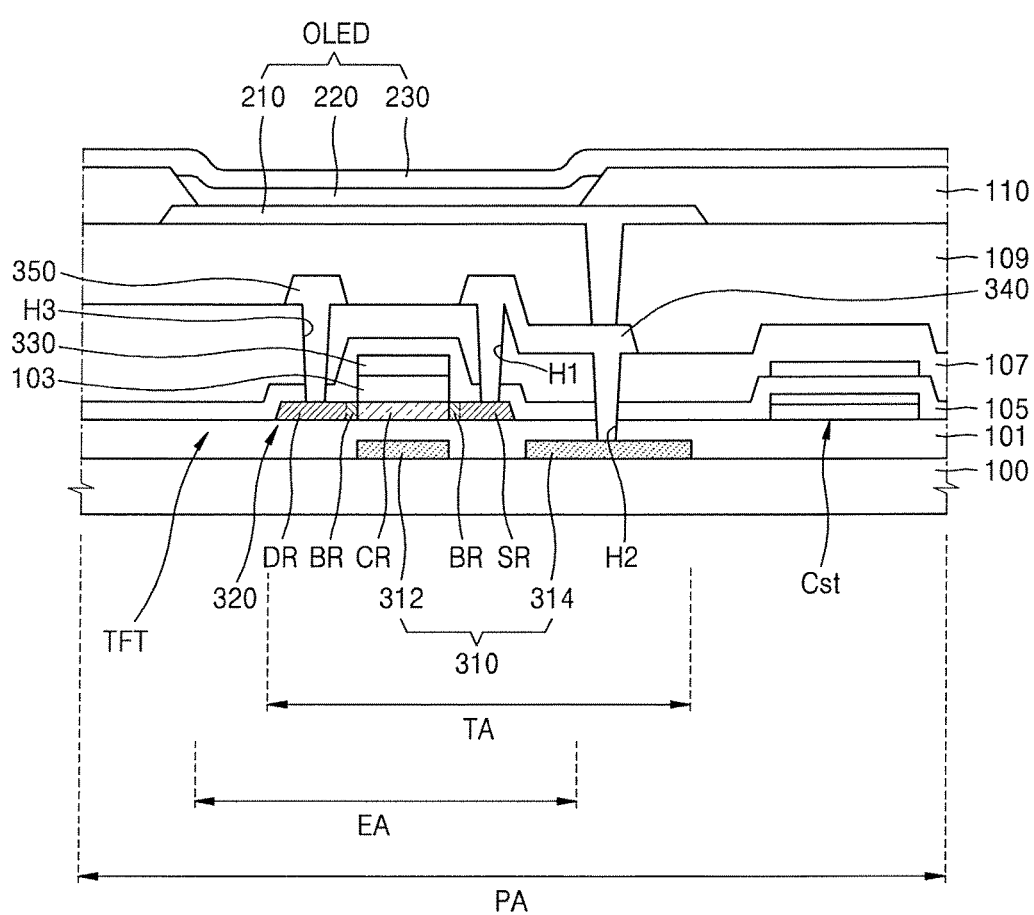
FIG. 3 is a cross-sectional view illustrating a pixel of an organic light-emitting device according to exemplary embodiment of the present invention.
Figure 4:
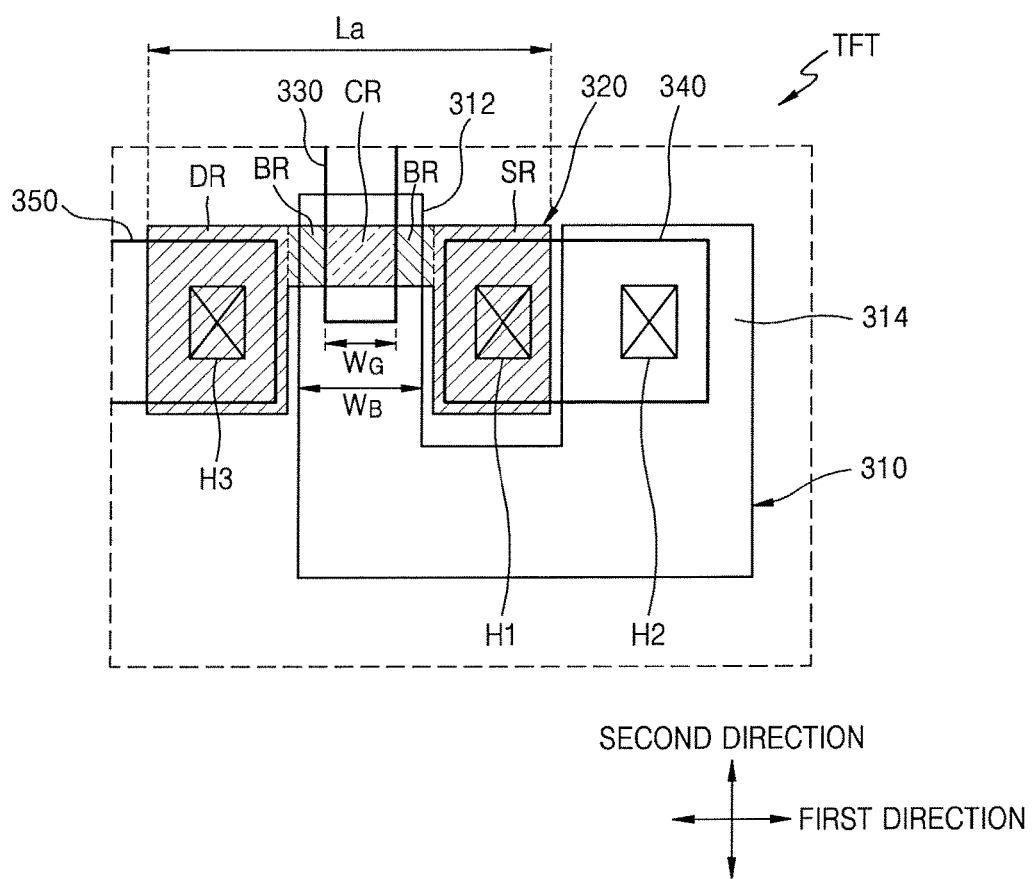
FIG. 4 is a plan view illustrating a thin film transistor of the pixel of FIG. 3.

FIG. 3 is an enlarged cross-sectional view of the display device illustrated in FIG. 2, showing a display unit of the display device. FIG. 4 is a plan view illustrating a thin film transistor TFT of the pixel of FIG. 3.

Referring to FIG. 3, a pixel circuit including a thin film transistor TFT, the storage capacitor Cst and the organic light-emitting diode OLED electrically connected to the pixel circuit may be disposed on the pixel area PA of the substrate 100. The thin film transistor TFT illustrated in FIG. 3 may be one of the switching thin film transistor T1 and the driving thin film transistor T2 described with reference to FIG. 2.

The substrate 100 may include at least one of various materials, for example, glass, a metal material, or a plastic material, such as polyethylene terephthalate (PET), polyethylene naphthalate (PEN), or polyimide.

The organic light-emitting diode OLED according to an exemplary embodiment of the present invention may be an organic light-emitting diode of a front light-emitting type, and thus an opening ratio of the organic light-emitting device 1 may be increased since the thin film transistor TFT and the organic light-emitting diode OLED overlap each other. The pixel area PA may include an emitting area EA, in which the organic light-emitting diode OLED is disposed, and a thin film transistor area TA, in which the thin film transistor TFT is disposed. Since at least a portion of the thin film transistor area TA and at least a portion of the emitting area EA may overlap each other, the opening ratio of the organic light-emitting device 1 may be increased, and a space between the substrate 100 and the organic light-emitting diode OLED may be effectively used.

The organic light-emitting diode OLED may include a pixel electrode 210, an emissive layer 220, and an opposite electrode 230.

The pixel electrode 210 may be a reflective electrode. The pixel electrode 210 may be a reflective film including silver (Ag), magnesium (Mg), aluminum (Al), platinum (Pt), palladium (Pd), gold (Au), nickel (Ni), neodymium (Nd), iridium (Ir), Chromium (Cr), or a mixture thereof. In another exemplary embodiment of the present invention, the pixel electrode 210 may include the above-described reflective film and a film which includes one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may be exposed by a pixel definition film 110 which is disposed on the pixel electrode 210, and the emissive layer 220 may be disposed on the exposed pixel electrode 210.

The emissive layer 220 may include a relatively low molecular weight organic compound or a relatively high molecular weight organic compound. A hole transport layer (HTL) or/and a hole injection layer (HIL) may be disposed between the pixel electrode 210 and the emissive layer 220.

The opposite electrode 230 may be a transparent electrode or a semi-transparent electrode. The opposite electrode 230 may include a thin semi-transparent metal film including at least one of lithium (Li), calcium (Ca), lithium fluoride calcium (LiF/Ca), lithium fluoride aluminum (LiF/Al), aluminum (Al), magnesium (Mg), silver (Ag), or a mixture of magnesium (Mg) and silver (Ag), which has a low work function, or may include a transparent film including at least one of indium tin oxide (ITO), indium zinc oxide (IZO), zinc oxide (ZnO), indium oxide ($In_2O_3$), indium gallium oxide (IGO), and aluminum zinc oxide (AZO). When the opposite electrode 230 includes the thin semi-transparent metal film including at least one of lithium (Li), calcium (Ca), lithium fluoride calcium (LiF/Ca), lithium fluoride aluminum (LiF/Al), aluminum (Al), magnesium (Mg), silver (Ag), or a mixture of magnesium (Mg) and silver (Ag), a transparent conductive film, such as indium tin oxide (ITO), indium zinc oxide (IZO), zinc oxide (ZnO), indium oxide ($In_2O_3$), indium gallium oxide (IGO), or aluminum zinc oxide (AZO), may be disposed on the above-described metal film and thus a relatively high resistance occurring due to a thickness of the thin metal semi-transparent film may be reduced or eliminated.

The thin film transistor TFT electrically connected to the organic light-emitting diode OLED and the storage capacitor Cst may be disposed below the organic light-emitting diode OLED, and may be covered by a first insulation film 109. The first insulation film 109 may be a planarization film.

Referring to FIGS. 3 and 4, a semiconductor layer 320 of the thin film transistor TFT may be disposed in the thin film transistor area TA. The semiconductor layer 320 may include at least one oxide selected from indium (In), gallium (Ga), stannum (Sn), zirconium (Zr), Vanadium (V), hafnium (Hf), cadmium(Cd), germanium (Ge), Chrome (Cr), titanium (Ti), and zinc (Zn). For example, the semiconductor layer 320 may include IGZO (InGaZnO, indium gallium zinc oxide).

The semiconductor layer 320 may include a channel region CR, a source region SR and a drain region DR which may be disposed opposite to each other with respect to the channel region CR. The source region SR and the drain region DR are an area having an electrical conductivity greater than an electrical conductivity of the channel region CR. In an exemplary embodiment of the present invention, the source region SR and the drain region DR may be conductive according to a plasma treatment or may have an electrical conductivity greater than the channel region CR by an ion-doping process.

A boundary region BR of the semiconductor layer 320 might not overlap a gate electrode 330 and may be adjacent to the channel region CR. The boundary region BR may be disposed between the source region SR and the channel region CR and may be disposed between the drain region DR and the channel region CR. The boundary region BR may be a non-overlapping region. The boundary region BR might not overlap with a bridge electrode 340, an electrode 350, and the gate electrode 330. The boundary region BR may be formed together with the source region SR and the drain region DR when the source region SR and the drain region DR are formed during the plasma treatment or the ion-doping process. The boundary region BR may have substantially the same electrical conductivity as the source region SR and the drain region DR.

The gate electrode 330 may be disposed on the semiconductor layer 320, and a gate insulating layer 103 may be disposed between the gate electrode 330 and the semiconductor layer 320. The gate electrode 330 may overlap the channel region CR. The gate electrode 330 may include a single layer or multiple layers including at least one material among aluminum (Al), platinum (Pt), palladium (Pd), silver (Ag), magnesium (Mg), gold (Au), Nickel (Ni), Neodymium (Nd), iridium (Ir), chromium (Cr), lithium (Li), calcium (Ca), molybdenum (Mo), titanium (Ti), tungsten (W), and Copper (Cu), for example.

The gate electrode 330 may be covered by a first interlayer insulation film 105 and a second interlayer insulation film 107. According to an exemplary embodiment of the present invention, two insulation films, for example, the first and second interlayer insulation films 105 and 107 may be disposed on the gate electrode 330. However, exemplary embodiments of the present invention are not limited thereto. For example, the gate electrode 330 may be covered by a single layer interlayer film.

The bridge electrode 340 may be disposed on the second interlayer insulation film 107 and may electrically connect the source region SR of the semiconductor layer 320 to a conductive layer 310, which may be disposed below the semiconductor layer 320. The bridge electrode 340 may contact the source region SR of the semiconductor layer 320 via a first hole H1 passing through the first and second interlayer insulation films 105 and 107, and may also contact the conductor layer 310 via the second hole H2 passing through a buffer layer 101.

The bridge electrode 340 may include a single layer or multiple layers including at least one material among aluminum (Al), platinum (Pt), palladium (Pd), silver (Ag), magnesium (Mg), gold (Au), Nickel (Ni), Neodymium (Nd), iridium (Ir), chromium (Cr), lithium (Li), calcium (Ca), molybdenum (Mo), titanium (Ti), tungsten (W), and Copper (Cu), for example. For example, the bridge electrode 340 may include a single layer including molybdenum (Mo) or titanium (Ti) or may include multiple layers including molybdenum/aluminum/molybdenum (Mo/Al/Mo) or titanium/copper (Ti/Cu).

The electrode 350 may be disposed on the same layer as the bridge electrode 340, may be spaced apart from the bridge electrode 340, and may be electrically connected to the drain region DR. The electrode 350 may contact the drain region DR via a third hole H3 passing through the first and second interlayer insulation films 105 and 107. The electrode 350 may include the same material of the bride electrode 340.

The conductive layer 310 may overlap the channel area CR of the semiconductor layer 320 and may be electrically connected to the source region SR of the semiconductor layer 320 through the bridge electrode 340. The conductive layer 310 may include a first portion 312, which may overlap the channel region SR of the semiconductor layer 320, and a second portion 314, which may be spaced apart from the first portion 312 and may contact the bridge electrode 340. An end part of the second portion 314 connected to the first portion 312 and the other end part of the second portion 314 spaced apart from the first portion 312, and the source region SR may be disposed between the first portion 312 and the other end part of the second portion 314. In another exemplary embodiment of the present invention, when the bridge electrode 340 contacts the drain region DR, the drain region DR may be disposed between the first portion 312 and the other end part of the second portion 314.

Since the conductive layer 310 may overlap the channel area CR of the semiconductor layer 320, the conductive layer 310 may hold carriers of a back channel portion of the semiconductor layer 320 and thus, a mobility of the carriers may be reduced. However, an output characteristic of the thin film transistor TFT may be increased. For example, it is possible to maintain a substantially constant current level after a threshold voltage. Thus, brightness of the light emitted from the organic light-emitting diode OLED may be substantially constantly maintained even when the organic light-emitting diode OLED is used for a relatively long time.

The conductive layer 310 need not overlap at least one of the source region SR and the drain region DR of the semiconductor layer 320. For example, the conductive layer 310 may overlap with the source region SR or the drain region DR. Thus, a parasite capacitance between the conductive layer 310 and the semiconductor layer 320 may be reduced or prevented.

A length of the semiconductor layer 320 in a first direction from the drain region DR toward the source region SR, a width of the first portion 312 of the conductive layer 310 in the first direction, and a width of the gate electrode 330 in the first direction may satisfy the following condition:

$$W_G \leq W_B < La.$$

Here, La is a length of the semiconductor layer 320 in the first direction, $W_B$ is a width of the first portion 312 of the conductive layer 310 in the first direction, and $W_G$ is a width of the gate electrode 330 in the first direction.

That is, the width $W_B$ of the first portion 312 of the conductive layer 310 in the first direction may be less than the length La of the semiconductor layer 320 in the first direction and may be equal to or greater than the width $W_G$ of the gate electrode 330 in the first direction. The width $W_B$ of the first portion 312 of the conductive layer 310 may be substantially the same as the width $W_G$ of the gate electrode 330, but by taking into account an alignment margin, the width $W_B$ of the first portion 312 of the conductive layer 310 may be greater than the width $W_G$ of the gate electrode 330 by about 8 μm.

The conductive layer 310 may include a light transmittance material. The conductive layer 310 may include at least one of a transparent conductive oxide layer and a semi-transparent metal layer. The transparent conductive oxide layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The semi-transparent metal layer may include silver (Ag) or a silver (Ag) alloy. In an exemplary embodiment of the present invention, the conductive layer 310 may include a transparent conductive oxide layer, a semi-transparent metal layer, or a multilayer (e.g., ITO/Ag/ITO) structure in which the transparent conductive oxide layer, the semi-transparent metal layer, and the transparent conductive oxide layer are stacked.

The bridge electrode 340 is illustrated to electrically connect the conductive layer 310 to the source region SR of the semiconductor layer 320. However, exemplary embodiments of the present invention are not limited thereto. For example, the bridge electrode 340 may electrically connect the conductive layer 310 to the drain region DR of the semiconductor layer 320.

Figure 5:
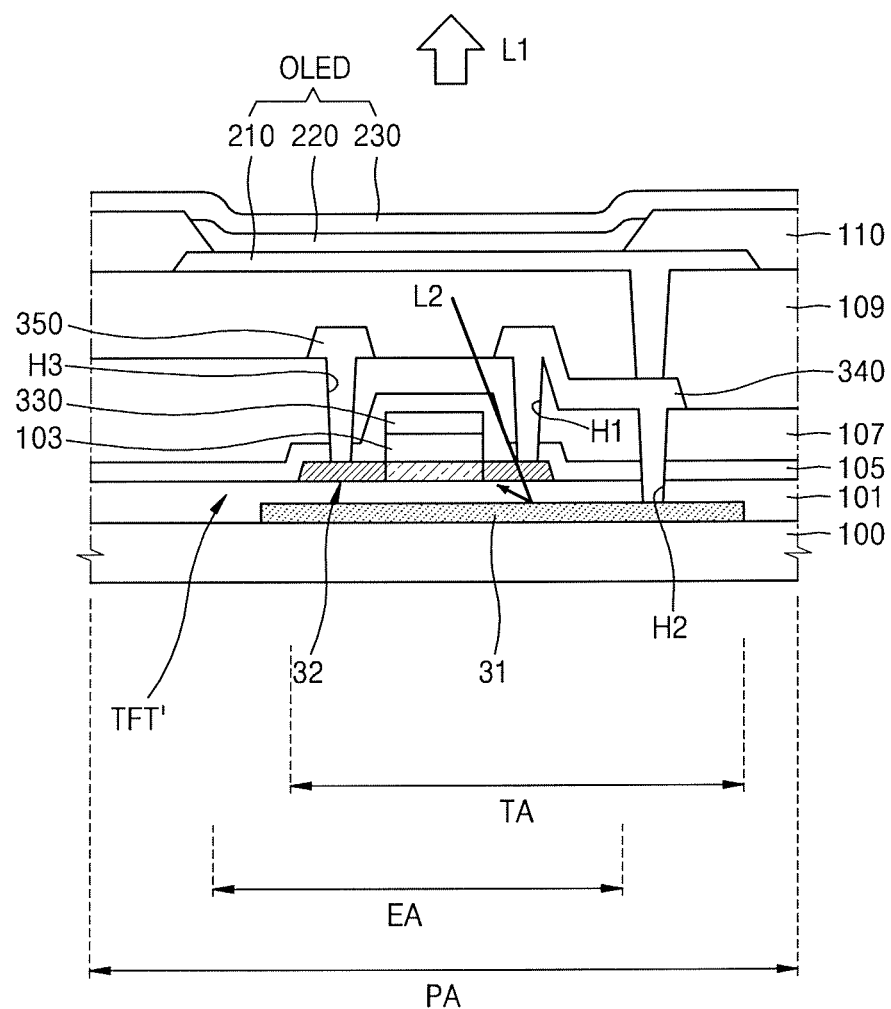
FIG. 5 is a cross-sectional view schematically illustrating an organic light-emitting device as a comparative example.
Figure 6:
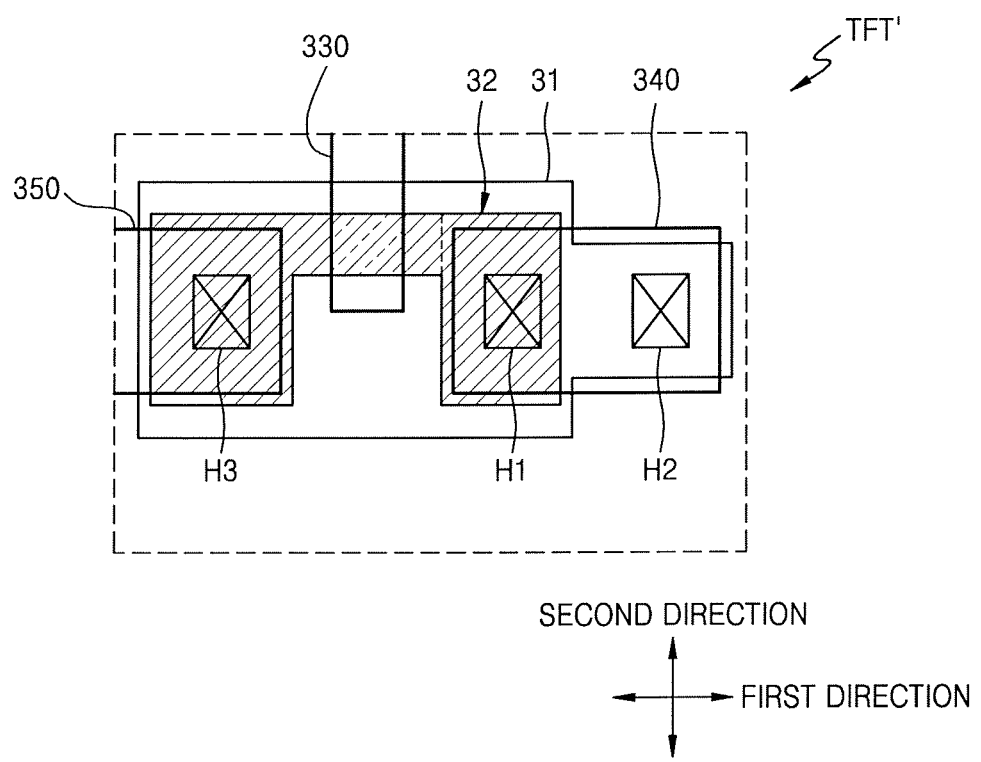
FIG. 6 is a plan view illustrating a thin film transistor of the organic light-emitting device of FIG. 5.

FIG. 5 is a cross-sectional view schematically illustrating an organic light-emitting device as a comparative example. FIG. 6 is a plan view illustrating a thin film transistor of the organic light-emitting device of FIG. 5.

Referring to FIGS. 5 and 6, the organic light-emitting device according to a comparative example may include a conductive layer 31 which is a reflective metal layer. The size of the conductive layer 31 may be larger than that of a semiconductor layer 32 and thus the conductive layer 31 may overlap the entire area of the semiconductor layer 32. A thin film transistor TFT' may be substantially the same with the TFT of the organic light-emitting device 1.

When the organic light-emitting device is a front light-emitting type display device (see, e.g., FIG. 5), since a thin film transistor area TA and an emissive area EA overlap each other, the organic light-emitting diode OLED and the semiconductor layer 32 may at least partially overlap each other. A relatively large portion of light L1 among the light emitted from an emissive layer 220 may be reflected by the pixel electrode 210 including a reflective metal and may be transmitted to an outside, and a relatively small portion of the light L2 may be directed toward a thin film transistor TFT' which is disposed below the emissive layer 220. The light L2 directed toward the thin film transistor TFT' may be reflected by the conductive layer 31 of a reflective metal layer and may be directed to the semiconductor layer 32. When the light L2 is directed onto the semiconductor layer 32 including the oxide semiconductor, a photo current may be generated and introduced into the semiconductor layer 32 such that the a characteristic of the thin film transistor TFT' may become degraded.

However, according to an exemplary embodiment of the present invention, the thin film transistor area TA and the emissive area EA may overlap each other, and the conductive layer 310 may include a light transmittance material as described with reference to FIGS. 3 and 4, for example. Thus, the light L2 might not be reflected by the conductive layer 310 and thus the light L2 might not be directed toward the semiconductor layer 320. Thus, the photo current may be reduced or prevented.

The conductive layer 31 according to the comparative example of FIG. 5 may entirely overlap the semiconductor layer 32, and thus a parasitic capacitance which may be induced between the conductive layer 31 and the semiconductor 32 may have a predetermined voltage.

However, according to an exemplary embodiment of the present invention, since the conductive layer 310 does not overlap with the source region SR and the drain region DR, the induction of the parasitic capacitance between the conductive layer 310 and the source region SR or the drain region DR may be reduced or prevented.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting device comprising:
a substrate comprising a pixel area;
an oxide semiconductor layer disposed in the pixel area, wherein the oxide semiconductor layer comprises a channel region, a source region and a drain region, and wherein the channel region is disposed between the source region and the drain region;
a gate insulating layer disposed on the oxide semiconductor layer;
a gate electrode disposed on the gate insulating layer;
a conductive layer disposed between the substrate and the oxide semiconductor layer, wherein a first portion of the conductive layer is electrically connected to one of the source region and the drain region via a bridge electrode, wherein the bridge electrode is in contact with the one of the source region and the drain region and a second portion of the conductive layer, and wherein the first portion of the conductive layer overlaps the channel region;
a first insulation film covering the gate electrode and the bridge electrode; and
an organic light-emitting diode comprising a pixel electrode disposed on the first insulation film in the pixel area, an emissive layer disposed on the pixel electrode, and an opposite electrode disposed on the emissive layer,
wherein at least a portion of the oxide semiconductor layer overlaps the organic light-emitting diode.

2. The organic light-emitting device of claim 1, wherein a length of the oxide semiconductor layer in a first direction, a width of the first portion of the conductive layer in the first direction, and a width of the gate electrode in the first direction satisfy the following condition:

$W_G \leq W_B < La$ wherein La is the length of the oxide semiconductor layer in the first direction, $W_B$ is the width of the first portion of the conductive layer in the first direction, and $W_G$ is the width of the gate electrode in the first direction.

3. The organic light-emitting device of claim 1, wherein the second portion is integrated with the first portion and overlaps the bridge electrode.

4. The organic light-emitting device of claim 3, wherein one of the source region and the drain region is disposed between the first portion and the second portion.

5. The organic light-emitting device of claim 1, wherein the conductive layer is not overlapped with at least one of the source region and the drain region of the oxide semiconductor layer.

6. The organic light-emitting device of claim 1, wherein the pixel electrode comprises a reflective electrode, and the opposite electrode comprises a transparent electrode or a semi-transparent electrode.

7. The organic light-emitting device of claim 1, wherein the conductive layer comprises at least one of a transparent conductive oxide layer and a semi-transparent metal layer.

8. The organic light-emitting device of claim 1, wherein the bridge electrode contacts the conductive layer and the source region of the oxide semiconductor layer, respectively.

9. The organic light-emitting device of claim 1, further comprising:
a buffer layer disposed between the conductive layer and the oxide semiconductor layer; and
an interlayer insulation film disposed between the gate electrode and the bridge electrode,
wherein the bridge electrode is in contact with the oxide semiconductor layer, which is exposed through a first hole which passes through the interlayer insulation film, and wherein the bridge electrode is in contact with the conductive layer, which is exposed through a second hole which passes through the buffer layer.

10. An organic light-emitting device comprising:
a substrate;
a semiconductor layer disposed on the substrate, wherein the semiconductor layer comprises a channel region, a source region and a drain region, wherein the source region and the drain region are spaced apart from each other, and wherein the channel region is disposed between the source region and the drain region;
a gate electrode overlapping the channel region, and disposed on the semiconductor layer;
a conductive layer disposed between the substrate and the semiconductor layer, wherein a first portion of the conductive layer is electrically connected to one of the source region and the drain region via a bridge electrode, wherein the bridge electrode is in contact with the one of the source region and the drain region and a second portion of the conductive layer, and wherein a first portion of the conductive layer overlaps the channel region;

a first insulation film covering the gate electrode and the bridge electrode;

a pixel electrode disposed on the first insulation film;

an emissive layer disposed on the pixel electrode; and an opposite electrode disposed opposite to the pixel electrode, wherein the emissive layer is disposed between the opposite electrode and the pixel electrode.

11. The organic light-emitting device of claim 10, wherein the semiconductor layer comprises an oxide of at least one of indium (In), gallium (Ga), tin (Sn), zirconium (Zr), Vanadium (V), hafnium (Hf), cadmium (Cd), germanium (Ge), Chrome (Cr), titanium (Ti), and zinc (Zn).

12. The organic light-emitting device of claim 10, wherein a width of the first portion of the conductive layer in a first direction from the drain region to the source region is less than a length of the semiconductor layer in the first direction.

13. The organic light-emitting device of claim 10, wherein a width of the first portion of the conductive layer in a first direction from the drain region to the source region is equal to or greater than a width of the gate electrode in the first direction.

14. The organic light-emitting device of claim 10, wherein the second portion is spaced apart from the first portion and is integrated with the first portion.

15. The organic light-emitting device of claim 10 wherein the conductive layer is not overlapped with at least one of the source region and the drain region.

16. The organic light-emitting device of claim 10, wherein the pixel electrode is a reflective electrode, and the opposite electrode is a transparent electrode or a semi-transparent electrode.

17. The organic light-emitting device of claim 10, wherein the conductive layer comprises at least one of a transparent conductive oxide and a semi-transparent metal.

18. The organic light-emitting device of claim 10, wherein the bridge electrode contacts the conductive layer and the source region of the semiconductor layer, respectively.

19. The organic light-emitting device of claim 1, wherein the conductive layer is not overlapped with at least one of the source region or the drain region of the oxide semiconductor layer, and wherein the conductive layer is not overlapped with a boundary region between the drain region and the channel region or is not overlapped with a boundary region between the source region and the channel region.

20. The organic light-emitting device of claim 10, wherein the conductive layer is not overlapped with a boundary region between the drain region and the channel region or is not overlapped with a boundary region between the source region and the channel region.

* * * * *